United States Patent [19]

Goshy et al.

[11] E Re. 28,832

[45] Reissued May 25, 1976

[54] COULOMETRIC METERING DEVICE

[76] Inventors: Allyn N. Goshy, 813 Queens Lane, Anoka, Minn. 55303; Russell L. Rehm, Rte. 5, Box 69, Excelsior, Minn. 55331

[22] Filed: June 11, 1975

[21] Appl. No.: 586,054

Related U.S. Patent Documents

Reissue of:

[64] Patent No.: 3,768,008
Issued: Oct. 23, 1973
Appl. No.: 290,573
Filed: Sept. 20, 1972

[52] U.S. Cl. ..... 324/94; 324/157
[51] Int. Cl.[2] ..... G01R 11/44
[58] Field of Search ..... 324/94, 182, 157, 142, 324/116; 194/11; 340/309.1, 309.6, 253 R; 307/126

[56] References Cited

UNITED STATES PATENTS

| | | | |
|---|---|---|---|
| 1,254,939 | 1/1918 | Schweitzer | 324/94 |
| 1,481,335 | 1/1924 | Anninger | 324/157 |
| 3,343,083 | 9/1967 | Beusman | 324/94 |
| 3,428,894 | 2/1969 | Boettcher | 324/94 |

FOREIGN PATENTS OR APPLICATIONS

| | | | |
|---|---|---|---|
| 858,573 | 12/1952 | Germany | 324/94 |
| 878,529 | 6/1953 | Germany | 324/94 |

*Primary Examiner*—Stanley T. Krawczewicz
*Attorney, Agent, or Firm*—Robert E. Granrud

[57] ABSTRACT

Electric metering device including at least two coulometric cells which experience a sharp voltage rise upon deplating. The current is metered by passing current through one cell until it is deplated, whereupon the sharp voltage rise causes a second cell to become conducting. In a typical application, the cells would then be replaced and recharged for reuse.

8 Claims, 2 Drawing Figures

COULOMETRIC METERING DEVICE

Matter enclosed in heavy brackets [ ] appears in the original patent but forms no part of this reissue specification; matter printed in italics indicates the additions made by reissue.

FIELD OF THE INVENTION

The present invention concerns a device for metering electric current usage.

BACKGROUND OF THE INVENTION

The electric power industry has always been looking for economical devices that would effectively meter current usage. As long ago as 1881, Edison U.S. Pat. No. 215,545 disclosed an electric meter based on the known fact that a certain unit of current will cause the deposition of a definite amount of copper from a proper solution. Electric current usage was determined by weighing the copper of an electrolytic cell at the beginning and the end of the measuring period. Similar electro-plating coulometric cells have been employed for the same purpose in many subsequent patents. For example, Schweitzer U.S. Pat. No. 1,422,484 connected an electro-plating coulometric cell in series with an alternating current circuit to open the circuit upon passage of a predetermined quantity of current.

A versatile electro-plating coulometric cell is sold by Spraque Electric Company under the trademark Koolometer. It employs a gold wire for one electrode and a silver can for the other. Current usage is measured by deplating a known mass of silver which had been deposited on the gold wire. As the silver is removed from the gold wire, there is an almost imperceptible rise in the voltage drop across the cell, but when the last trace of silver has been deplated, the voltage rises sharply from one to three orders of magnitude. This voltage rise can be used as in Schweitzer U.S. Pat. No. 1,422,484 to interrupt the circuit. Of course, this would be impractical for normal electric metering use where the abrupt interruption of current would not be tolerated.

Regardless of the long-time availability of various electro-chemical coulometric cells, the electric power industry continues to meter current usage with electromechanical meters which are not only expensive but require periodic visual readings by a meter-reader. Present efforts at economy seem to be directed almost exclusively at the elimination of the meter-reader by employing systems for automatically transmitting information from the electro-mechanical meter to an electronic data collecting medium. While saving manpower, any such system appreciably increases capital costs and does nothing to minimize the high maintenance expense which the complex electro-mechanical meters inherently involve.

THE PRESENT INVENTION

A radically different approach to the problem of reducing the cost of metering electric current is involved in our invention. This new approach makes use of rechargeable electro-plating coulometric cells which experience a sharp voltage rise upon deplating, such as the Sprague Koolometer. In brief, our invention employs a current transformer having a primary winding for connection to a power line to be metered, a full-wave rectifier including a center-tap secondary winding on the transformer, and at least two coulometric cells which experience a sharp voltage rise upon deplating. Each coulometric cell consists of an anode, a cathode and a plating electrolyte. For economy, a pair of cells may share either the anode or the cathode. When the Spraque Koolometer is used as the coulometric cell, a gold wire of high purity serves as one electrode and a silver can as the other. Normally the can is the cathode and the gold wire is the anode. The coulometric cell is ready for use when a known mass of the plating has been plated on the anode and is deplated by current flowing through the cell.

The metering device further includes a switching device which normally connects only a first of said coulometric cells across the rectifier. The switching device is responsive to the sharp voltage rise upon deplating of the first coulometric cell for connecting a second of the coulometric cells across the rectifier and for providing an indication of this. For example, a lamp may be illuminated or a buzzer may be activated in response either to the sharp voltage rise in the first coulometric cell or to the flow of current through the second coulometric cell.

In a practical application, the first coulometric cell may be initially charged so that it will become fully deplated after about 30 days, and the second coulometric cell may become fully deplated approximately three days later. The metering device may include means for sensing the sharp voltage rise in the second coulometric cell and for thereupon interrupting current flow in a power line to which the device is connected. This would give the consumer about three days within which to substitute a freshly charged metering device.

A differential deplating rate in a two-cell meter may be accomplished by normally connecting the first coulometric cell across the rectifier through a first resistance and connecting the second coulometric cell across the rectifier upon actuation of the switching device through a second resistance which is small relative to the first. If the two coulometric cells have the same initial charge and the first resistance is ten times as large as the second, the second coulometric cell will become fully deplated in about one-tenth the time for deplating the first. Alternatively, the two resistances may be equal and the differential in deplating rate may be accomplished by charging the two cells differently. The former is preferred because complete deplating is more readily sensed at relatively rapid rates of deplating.

While two coulometric cells will be sufficient for most applications, additional cells may be added for special purposes. For example, the metering device may have several coulometric cells which deplate sequentially at equal rates plus a final coulometric cell which deplates at a faster rate and finally interrupts the power. By providing a plurality of indicator lights to indicate which cell is operational, the approximate rate of power consumption can be visually monitored.

In order to realize the full economies afforded by the present invention, it is expected that the consumer will replace a discharged metering device and take it to an agency which will give it a charge as requested by the consumer. If the consumer requests and is willing to pay for 3 or 4 months of uninterrupted service, he will be able to do so. If his request exceeds the capacity of his present metering device, he may request a substitute having a larger capacity. Since he will be paying only for the amount of charge supplied, he may if he wishes bring the meter in before the first coulometric cell has been deplated and pay only for the charge added to the remainder of the previous charge. Thus, the consumer has the freedom to pay for his electric power when and as often as he wishes.

THE DRAWING

In the drawing:

FIG. 1 is a circuit diagram of a metering device of the invention shown connected to a power line and including means for interrupting the power line when the charge has been exhausted; and FIG. 2 is a circuit diagram including a metering device of the invention employing an electro-mechanical switching device.

DESCRIPTION OF PREFERRED EMBODIMENTS

Figure 1:
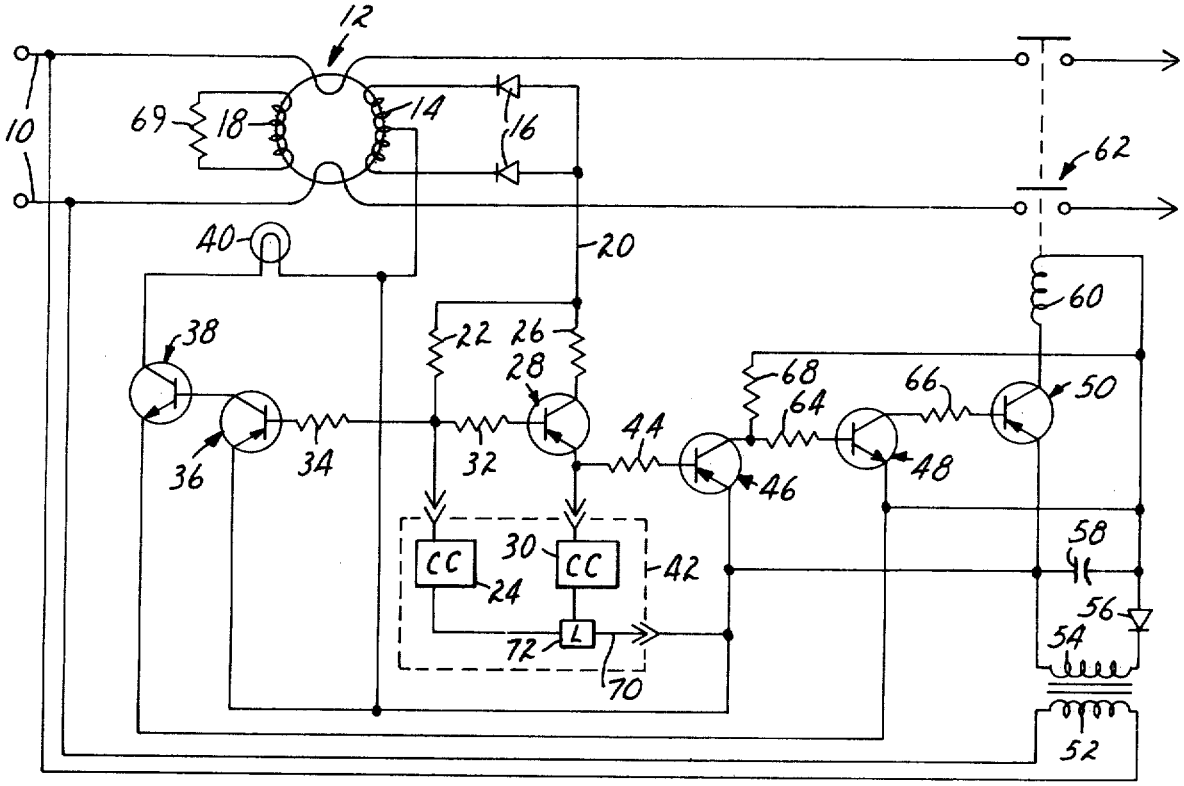

Referring to FIG. 1, a 220-volt AC power line 10 is connected to single-turn primary windings on current transformer 12 which has a linear response. A center-tap secondary winding 14 on the transformer is connected to a pair of germanium diodes 16 to provide a full-wave rectifier. Another secondary winding 18 provides a means for adjusting the response of the transformer 12. With each side of the secondary winding 14 having 275 turns, 0.3 volt is induced on the lead 20 for each ampere carried by the power line 10 and is applied across a first resistor 22 and a first coulometric cell 24. The lead 20 is also connected to a second resistor 26 which in turn is connected through a transistor 28 which remains nonconducting until a forward bias is applied sufficient to exceed the internal resistance of the transistor which may be about 0.1 volt. The emitter of the transistor 28 is connected to a second coulometric cell 30 which is identical to and connected in parallel with the first coulometric cell 24.

Initially each of coulometric cells 24 and 30 is charged to its full capacity of 3,000 micro-amperes. Since the resistor 22 is 150,000 ohms, a current of two micro-amperes will pass through the cell 24 for each ampere carried by the power line 10. While current is flowing through the charged cell 24, there is initially a voltage drop of about 0.01 volt across the cell so that the transistor 28 remains nonconducting and no current flows through the cell 30.

The current flowing through the cell 24 causes gradual deplating, and upon complete deplating there is a sharp voltage rise across the first cell 24 to more than 0.15 volt. This applies a forward bias to the transistor 28 to cause it to become conducting, thereby electrically connecting the second coulometric cell 30 to the full-wave rectifier through the resistor 26 which has a resistance of only 10,000 ohms. A small portion of the current in the cell 30 flows through resistors 22 and 32, the latter having a resistance of 1,000 ohms. Approximately the same current flow in the power line 10 deplates the cell 30 at approximately 15 times the rate that the cell 24 had been deplated.

The sharp voltage rise upon deplating of the first cell 24 also applies a forward bias via a 1K resistor 34 to a transistor 36 which is identical to the transistor 28. This causes transistor 36 to become conducting which in turn causes a transistor 38 to become conducting to produce a current gain sufficient to illuminate a lamp 40. This provides a visual indication that the first coulometric cell 24 has been fully deplated and that both cells will soon become deplated because the second cell 30 deplates relatively quickly.

At this point, the consumer removes the cells 24 and 30 which have been assembled into a removable cartridge 42, inserts another charged cartridge and takes the spent cartridge 42 to an agency for recharging the cells 24 and 30. Hence, each metering device should have two cartridges to permit continuous power flow.

Upon complete deplating of the second coulometric cell 30, a forward bias is applied through a 1K resistor 44 to a transistor 46 which is identical to transistors 28 and 34, thus causing the transistor 46 to become conducting which in turn causes a current-gain transistor 48 and a power transistor 50 to become conducting.

Connected across the incoming leads of the power line 10 is the primary winding 52 of a transformer. The secondary winding 54 is connected to a half-wave rectifier 56 such that there is normally a drop of about 10 volts across a capacitor 58. As soon as the power transistor 50 becomes conducting, the capacitor 58 discharges through a coil 60 which opens a circuit breaker 62 in the load leads of the power line 10.

The circuit breaker can only be closed manually, but it can be opened either manually or electrically. If someone tries to close the circuit breaker when the cartridge 42 is not in position, on the first cycle of incoming power, current inducted in the secondary winding 14 of the current transformer 12 would apply a forward bias to the transistor 28 which would cause it to conduct, applying a forward bias in turn to transistors 46, 48 and 50. This would energize the coil 60 to kick out the circuit breaker 62. This happens so fast that the circuit breaker will virtually appear not to have been activated. The same action would take place if one inserted a cartridge 42 of deplated cells.

Preferably the circuitry which operates the circuit breaker 62 incorporates a delay (not shown) which allows the user a reasonable fixed time limit, such as 20 seconds, within which to replace the cartridge 42 without opening the circuit breaker 62. The delay should be effective only if the cell 30 has not been completely deplated.

The circuit illustrated in FIG. 1, which has a capacity of about 600 KWH, has been successfully operated with the following components:

| | |
|---|---|
| Diodes 16 | 1N34 |
| Winding 18 | 275 turns |
| Coulometric cells 24, 30 | Sprague "Koolometer" Type 12B |
| Transistors 28, 36, 46 | 2N711 |
| Transistors 38, 48 | 2N1302 |
| Transistor 50 | GP2354 |
| Lamp 40 | No. 47 |
| Transformer primary 52 | 2000 turns |
| Transformer secondary 54 | 70 turns |
| Half-wave rectifier 56 | 1N2070 |
| Capacitor 58 | 1000 μfd 15 v |
| Resistor 64 | 3900 ohms |
| Resistor 66 | 470 ohms |
| Resistor 68 | 22K |
| Resistor 69 | 47 ohms |

The removable cartridge 42 includes in the common lead 70 from the cells 24 and 30 a combination of magnetically controlled reed switches which provide a locking device 72. When the cartridge is inserted into a housing containing the balance of the FIG. 1 circuitry, a magnet combination (not shown) in the housing sets the reed switches to close the circuit to the leads 70. If the codes of the combinations do not match, the circuit will remain open. Such locking devices are described in U.S. Pat. Nos. 3,215,903; 3,430,200 and 3,444,711.

By making the cartridge 42 a sealed unit, the locking device 72 prevents unauthorized persons from recharging the cells 24 and 30. When the cartridge 42 is removed, the locking device 72 is open so there is no connection between the common lead 70 and the cells. In order to recharge the cells 24 and 30, an agency would need to know the code of the locking device 72 and would set that code into a magnet combination which would be incorporated into the charging device.

The locking device 72 has the further benefit that one cannot steal a cartridge from one metering device for use in another.

Various modifications of the basic circuitry and components thereof will readily occur to those skilled in the art who read the foregoing description. For example, it would normally be preferred to substitute for the lamp 40 a flickering or flashing light which will surely attract attention. If desired, an audible device may be used and would surely be preferred for blind persons. Normally, the main circuitry of the metering device will be located where the power enters the building, but many users will prefer that the lamp 40 or other indicator be located where it will be promptly noticed, such as in the kitchen.

For economy, it would be desirable to reduce the number of transistors, as by using only one transistor in place of transistors 36 and 38, as long as the lamp 40 or other indicator and the circuit breaker 62 can be actuated with assurance.

Figure 2:
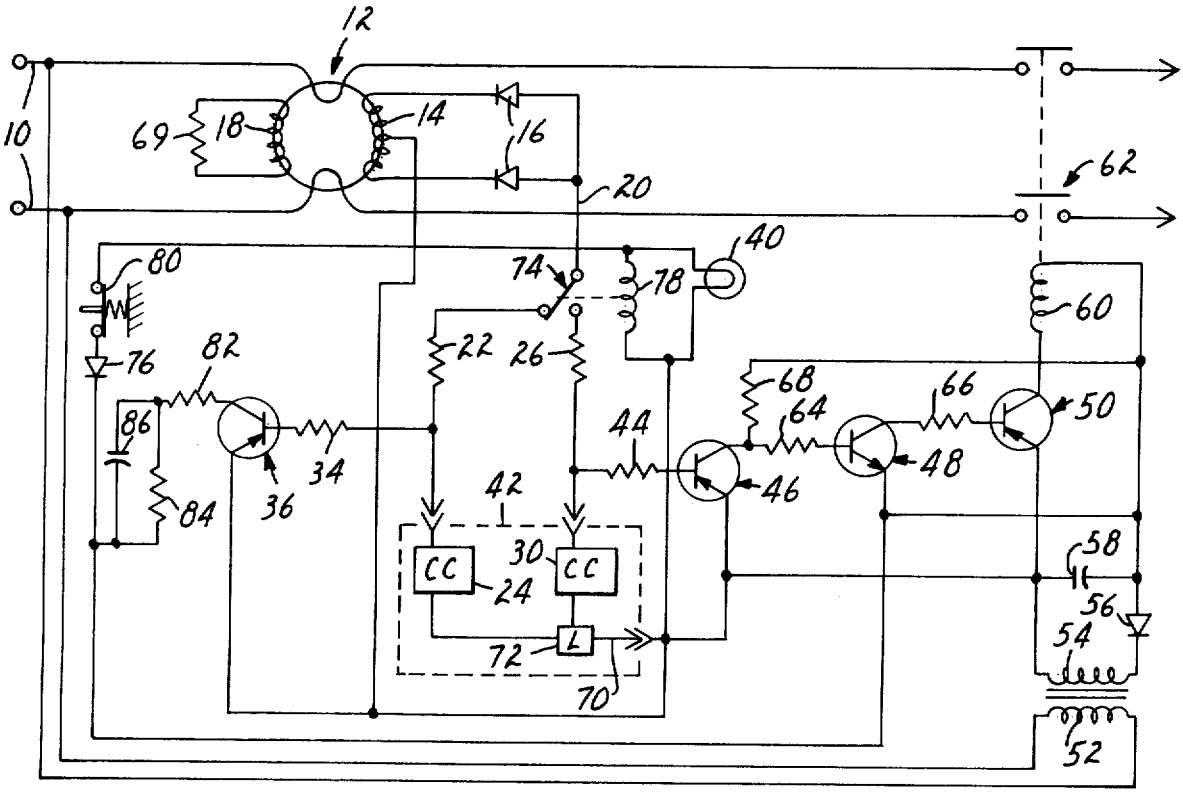

If desired, other types of switching devices can be used such as illustrated in FIG. 2, which shows a circuit including many of the same components as in FIG. 1. Instead of the transistor 28 of FIG. 1, the circuit of FIG. 2 has a magnetically operated reed switch 74 which is initially in the position shown to allow current to flow through the first coulometric cell 24. When the cell 24 is deplated, the voltage rise biases the transistor 36 to conduction to apply gating current to a silicon controlled rectifier 76. This enables current to flow through the lamp 40 and through a coil 78 around the reed switch 74 to connect the full-wave rectifier to the second coulometric cell 30.

When the user changes cartridges, he presses a reset switch 80 to interrupt current flow through the coil 78, thus returning the switch 74 to its original position. Preferably the reset switch 80 is so positioned that it is actuated by insertion of the cartridge 42 into the housing.

The circuit illustrated in FIG. 2 has been successfully operated with the following components:

| | |
|---|---|
| Rectifier 76 | GE C6F |
| Resistor 82 | 10K |
| Resistor 84 | 1K |
| Capacitor 86 | 0.01 μfd. |

We claim:

1. A device for metering electric current usage comprising:

a current transformer having a primary winding for connection to a power line to be metered, a full-wave rectifier including a center-tap secondary winding on the transformer,

*a removable cartridge containing* at least two electroplating coulometric cells, each of which initially has a known plating charge and experiences a sharp voltage rise upon deplating, a switching device normally connecting only a first of said coulometric cells across the rectifier, which switching device is responsive to the sharp voltage rise in the first coulometric cell for connecting the second coulometric cell across the rectifier and for providing a perceptible indication thereof *to warn that the cartridge needs to be removed to recharge the cells.*

2. A metering device as defined in claim 1 wherein the first coulometric cell is normally connected across the rectifier through a first resistance and the second coulometric cell is connected across the rectifier upon actuation of the switching device through a second resistance which is small relative to the first resistance so that the second coulometric cell is deplated at a faster rate than the first.

3. A metering device as defined in claim 2 and further including means for sensing the sharp voltage rise in the second coulometric cell and for thereupon interrupting current flow in a power line to which the device is connected.

4. A metering device as defined in claim 2 having two coulometric cells of equal capacity wherein the second resistance is at most one-tenth the first resistance so that the rate of deplating the second coulometric cell is at least ten times that of the first.

5. A metering device as defined in claim 1 wherein each coulometric cell consists of an anode, a cathode and a plating electrolyte, a known mass of which is initially plated on the anode, and each cell experience a sharp voltage rise when the electrolyte is deplated from the anode.

6. Method for metering electric current in a power line employing *a device including a removable cartridge containing* at least two coulometric cells which experience a sharp voltage rise upon deplating, each of which initially has a known plating charge, comprising the steps of 1. initially shunting current from the power line through only a first of the coulometric cells,
2. sensing for the sharp voltage rise upon deplating of the first cell and upon so sensing,
3. shunting current from the power line through a second of the coulometric cells and providing a perceptible indication thereof *to warn that the cells need recharging,*
4. *removing the cartridge from the device to apply a new known plating charge.*

*7. Method for metering electric current in a power line employing a device including a removable cartridge containing at least two coulometric cells, each of which initially has a known plating charge appied to one electrode and experiences a sharp voltage rise upon deplating, comprising the steps of*

*1. initially shunting current from the power line through only a first of the coulometric cells,*

*2. sensing for the sharp voltage rise upon deplating of the first cell and upon so sensing,*

*3. shunting current from the power line through a second of the coulometric cells and providing a perceptible indication thereof to warn that the cells will need recharging,*

*4. replacing the spent cartridge with another charged cartridge, and*

*5. taking the spent cartridge to an agency for recharging.*

*8. A metering device as defined in claim 1 including nother charged cartridge to substitute for said removable cartridge to permit said removable cartridge to be taken to an agency for recharging.*

* * * * *